United States Patent [19]
Kalkhoran et al.

[11] Patent Number: 5,671,914
[45] Date of Patent: Sep. 30, 1997

[54] MULTI-BAND SPECTROSCOPIC PHOTODETECTOR ARRAY

[75] Inventors: Nader M. Kalkhoran, Tewksbury; Fereydoon Namavar, Westford, both of Mass.

[73] Assignee: Spire Corporation, Bedford, Mass.

[21] Appl. No.: 553,972

[22] Filed: Nov. 6, 1995

[51] Int. Cl.$^6$ .................................................. H01L 31/00
[52] U.S. Cl. ................. 257/77; 257/440; 257/437; 257/443; 257/446
[58] Field of Search ........................ 257/440, 443, 257/446, 437, 77

[56] References Cited

U.S. PATENT DOCUMENTS

| | | | |
|---|---|---|---|
| H1423 | 4/1995 | Flesner et al. | 257/347 |
| 4,555,720 | 11/1985 | Readhead | 257/440 |
| 4,614,871 | 9/1986 | Driscoll | 250/372 |
| 4,633,031 | 12/1986 | Todorof | 257/440 X |
| 4,763,189 | 8/1988 | Komatsu et al. | 257/440 X |
| 4,835,393 | 5/1989 | Krauss | 250/373 |
| 4,977,325 | 12/1990 | Bowen et al. | 250/461.2 |
| 5,093,564 | 3/1992 | Miyagaki et al. | 250/208.1 |
| 5,264,693 | 11/1993 | Shimabukuro et al. | 250/207 |
| 5,306,904 | 4/1994 | Shimabukuro et al. | 250/207 |
| 5,329,110 | 7/1994 | Shimabukuro et al. | 250/207 |
| 5,360,987 | 11/1994 | Shibib | 257/446 |
| 5,374,841 | 12/1994 | Goodwin | 257/440 X |
| 5,420,432 | 5/1995 | Manook et al. | 250/373 |

OTHER PUBLICATIONS

J.A. Powell et al., "Growth and Characterization of Cubic SiC Single–Crystal Films on Si", *J. Electrochem. Soc.: SOLID–STATE SCIENCE AND TECHNOLOGY*, vol. 134, pp. 1558–1564 (Jun. 1987).

Jean–Pierre Colinge, "Silicon–on–Insulator Technology: Materials to VLSI", The Kluwer international series in engineering and computer science, Chapter 2—SOI Materials, including Bibliography (1991), Kluwer Academic Publishers, Mass., USA.

*Primary Examiner*—William Mintel
*Attorney, Agent, or Firm*—Thomas J. Engellenner; John V. Bianco; Lahive & Cockfield, LLP

[57] ABSTRACT

A multi-band spectroscopic photodetector array including a substrate having a buried insulator layer in the substrate for electrically isolating a lower section of the substrate located below the insulator layer form an upper section of the substrate located above the insulator layer; and a plurality of photodetection elements each formed on a different portion of the upper layer and each including elements for detecting photons in a selected wavelength range; wherein each of the different portions of the upper section has a different thickness and wherein the thickness at least in part determines the selected wavelength of the photons detected by each of the detection elements.

55 Claims, 12 Drawing Sheets

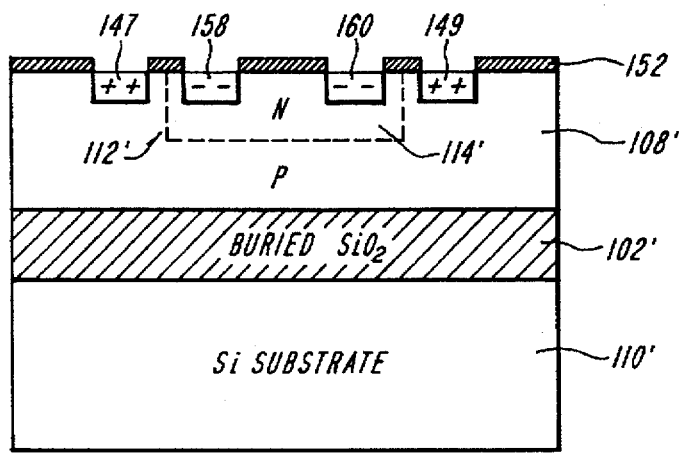
*FIG. 5D*
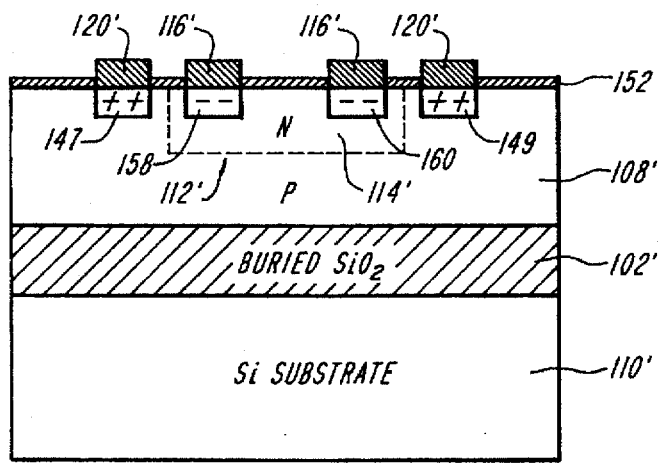
*FIG. 5E*
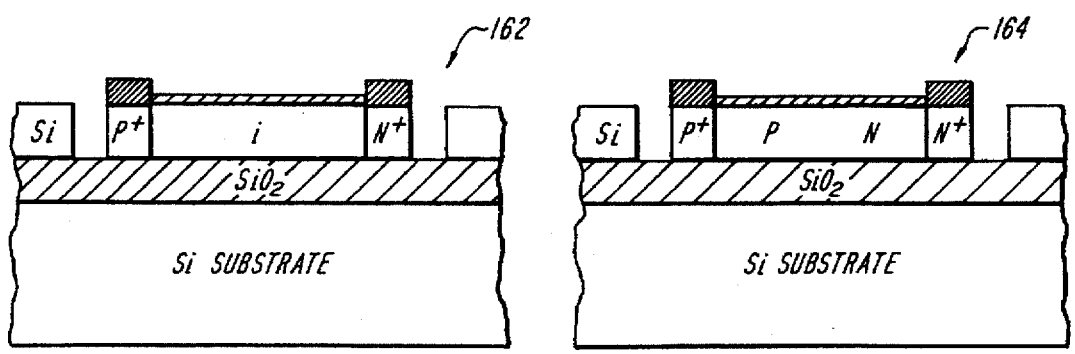
*FIG. 6A*          *FIG. 6B*

5,671,914

MULTI-BAND SPECTROSCOPIC PHOTODETECTOR ARRAY

REFERENCE TO RELATED PATENTS

The present application is related to U.S. patent application Ser. No. 08/553,875 entitled "Wavelength Selective Photodetector," assigned to the assignee of the present application and filed on even date herewith, the disclosure of which is incorporated herein by reference.

BACKGROUND OF THE INVENTION

The present invention relates generally to semiconductor photodetectors. More particularly, the invention relates to a monolithic multi-band spectroscopic photodetector array.

For some time, there has existed a need for improved spectrometers. Spectrometers are devices for measuring the intensity of photons at a plurality of wavelengths. Typically, current spectrometers either use optical interference filters (e.g., gratings) for dispersing light to detector arrays or a monochromator in conjunction with a rotating grating. Both of these systems suffer from several drawbacks. By way of example, both types of spectrometers are relatively expensive and bulky, and require periodic adjustment. Additionally, interference filters tend to significantly attenuate the incident UV light. Further, and debris can become lodged between the gratings and the photodetector.

The high cost and complex operation of existing spectrometers limit their use unsuitable for many tasks. For example, in space applications, instruments can be exposed to large mechanical forces during launching and to high dosages of radiation while in space. The large mechanical forces can render current spectrometers inoperative and the costs of calibrating and/or repairing spectrometers in space can be prohibitive.

Accordingly, an object of the present invention is to provide a filterless photodetector array.

A further object of the invention is to provide a compact inexpensive photodetector array.

Another object of the invention is to provide a photodetector array that is radiation hard and capable of withstanding large mechanical forces with minimized repair or recalibration requirements.

An additional object of the invention is to provide a compact inexpensive photodetector array that is suitable for a variety of commercial applications.

Other general and specific objects of the invention will in part be obvious and will in part appear hereinafter.

SUMMARY OF THE INVENTION

The foregoing objects are attained by the invention, which provides a multi-band band spectroscopic photodetector array. According to one preferred embodiment of the invention, the photodetector array includes a substrate, preferably Si based, having a buried insulator layer, and a plurality of photodetection elements. The insulator layer is preferably fabricated at a selected depth in the substrate and electrically isolates a lower section of the substrate located below the insulator layer from an upper section of the substrate located above the insulator layer. According to various embodiments of the invention, the insulator layer can be constructed from silicon oxide, silicon dioxide, silicon nitride, silicon oxynitride or aluminum oxide. Each of the photodetection elements, which are preferably photodiodes, is fabricated on a different portion of the upper section of the substrate. Each of the different portions of the upper section has a different thickness. The differing thicknesses, at least in part, provides different long wavelength cutoffs for each of the plurality of photodiodes. The long wavelength cutoffs are also affected by the energy band gap of the material from which the particular portion of the top section is fabricated. Thus according to one embodiment, the different portions of the upper section are fabricated from Si. According to another embodiment, the different portions of the upper section is fabricated from SiC. In yet a further embodiment, each portion of the upper section is formed as a dual layer structure having a top layer of SiC and a bottom layer of Si. By varying the thickness and/or material composition of different portions of the upper section, the long wavelength cutoffs of the each of the photodetectors can be adjusted.

A spectroscopic photodetector array according to the invention has a broad range of applications. By way of example, it can be employed in low cost, rugged spectrometers. As previously mentioned, spectrometers can be very costly and can include large bulky monochromators and adjustable moving gratings. Such spectrometers can be difficult to employ in harsh environments, such as experienced in space applications. However, a solid state array of wavelength selective photodetectors, such as provided by the invention, is inherently radiation hard and does not employ any moving parts requiring periodic adjustment. Thus, the present invention can replace prior art type spectrometers in virtually any application requiring exposure to a harsh environment.

A spectroscopic photodetector array, according to one preferred embodiment of the invention, has an upper section that is fabricated from Si and detects photons in at least three different wavelength ranges (although there is virtually no limit to the number of wavelength ranges that can be employed). More specifically, the photodetector includes photodetection elements for detecting photons having long wavelength cutoffs of about 400 nm (UV), about 600 nm (visible) and about 800 nm (near IR). To achieve these long wavelength cutoffs, the photodetector can be formed with a portion of the upper section having a thickness between about 500 Å and about 2000 Å; a portion having a thickness between about 3000 Å and about 6000 Å; and a portion having a thickness between about 7000 Å, and about 10000 Å.

As mentioned above, according to one preferred embodiment, the photodetection elements are preferably photodiodes fabricated on different portions of the upper section. According to a further embodiment, each of the different portions of the upper section includes an n-type doped region and a p-type doped region and each of the photodiodes are formed as a semiconductor junction between the n-type doped region and the p-type doped region. To ensure independent operation of each photodiode, the n-type doped regions of the different portions of the upper section are electrically isolated from each other. Alternatively, the p-type doped regions of the different portions of the upper section can be electrically isolated from each other. The semiconductor junctions can be formed as either n-on-p or a p-on-n junctions. In the case where the upper section of the substrate is Si, the n-type dopant is preferably arsenic (As) and the p-type dopant is preferably boron (B). By way of example, for a Si upper section and an n-on-p structure, the p-type doped regions can be doped to have a dopant concentration in a range between about $1\times10^{15}$/cm$^3$ and about $1\times10^{20}$/cm$^3$ and the n-type doped region can be doped to have a dopant concentration in a range between about $1\times10^{16}/cm^3$ and about $1\times10^{20}/cm^3$. Alternatively, for a p-on-n structure, the n-type doped region can be doped to have a dopant concentration in a range between about $1\times10^{15}/cm^3$ and about $1\times10^{20}/cm^3$ and the p-type doped region can be doped to have a dopant concentration in a range between about $1\times10^{16}/cm^3$ and about $1\times10^{20}/cm^3$. Preferably, the upper region in either the n-on-p or p-on-n structure has a higher doping concentration than does the lower region. In the case where the upper section is SiC, the p-type dopant is preferably aluminum (Al) or boron (B) and the n-type dopant is preferably nitrogen (N) or phosphorous (P).

According to one embodiment, the different portions of the upper section are fabricated as two layer structures. The two layer structures have top layers of SiC and bottom layers of Si. Each of the photodiodes can be formed either as a homojunction, i.e. completely within the SiC layer, or as a heterojunction, i.e. with the junction formed at the interface of the SiC layer and the Si layer.

In operation, photons of varying wavelength fall incident on the upper section and pass through the semiconductor junctions of the photodiodes thus, generating corresponding electrical output signals from each photodiode. The buried insulator layer preferably reflects photons, having wavelengths shorter than the long wavelength cutoffs of each of the photodiodes back through the photodiode junctions, thus, increasing the quantum efficiency of each photodiode in its particular wavelength range of operation. Photons having wavelengths longer then each of the selected long wavelength cutoffs pass through the buried insulator layer to the lower section of the substrate and are isolated from further contribution to the electrical output signals. The thickness of the different portions of the upper section, along with the energy band gap of the material from which each of the portions of the upper section is fabricated determines the long wavelength cutoff for each photodiode. A spectroscopic photodetector array according to the invention preferably includes ohmic contacts for electrically connecting to each of the photodiodes for providing access to the electrical output signals from each of the photodiodes.

In a further embodiment of the invention, the photodetection elements include an antireflective coating at the surface for reducing reflectance at wavelengths shorter than its long wavelength cutoff. The antireflective coating can be formed, for example, from one or more layers of SiO, $SiO_2$, ZnS, $Si_3N_4$, $TiO_2$, $Ta_2O_5$, SiC and/or MgF.

BRIEF DESCRIPTION OF THE DRAWINGS

For a fuller understanding of the nature and objects of the present invention, reference should be made to the following detailed description and the accompanying drawings, in which:

FIGS. 5A–5E depict alternative processing steps for fabricating a wavelength selective photodetector of the type shown in FIG. 1;

FIGS. 6A and 6B show alternative photodiode junction arrangements for the wavelength selective photodetector of FIG. 1;

DETAILED DESCRIPTION

The present invention relates generally to wavelength selective photodetectors. More particularly, the invention relates to solid-state wavelength selective photodetectors which implement wavelength selectivity without use of external optical filters. According to a preferred embodiment, the present invention employs silicon-on-insulator (SOI) structures to realize filterless, wavelength selective detectors which can efficiently detect photons of particular wavelengths, while exhibiting minimum sensitivity to photons of other wavelengths.

Figure 1:
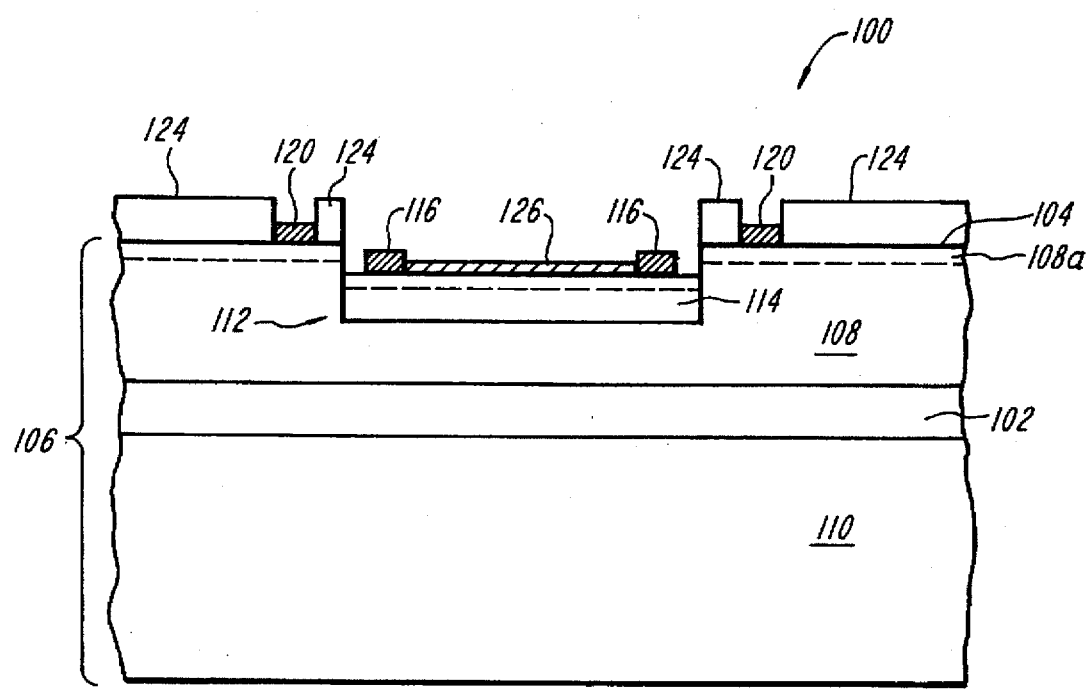
FIG. 1 is a cross sectional view of a wavelength selective photodetector according to one embodiment of the invention.

FIG. 1 shows a cross sectional view of a wavelength selective photodetector 100 according to one embodiment of the invention. The detector 100 includes a buried insulator layer 102 implanted to a selected depth below the surface 104 of a Si substrate 106. The buried insulator layer 102 divides the Si substrate 106 into a relatively thin upper section 108 and a relatively thick lower section 110. The depth to which the buried layer is implanted determines the thickness of the upper section 108. A photodiode 112 is fabricated on the upper section 108. The upper section 108 is preferably p-type doped. The photodiode 112 includes an n-type doped layer 114 formed on the p-type doped upper section 108. Ohmic contacts 116, formed as a ring on the n-type doped layer 114, provides electrical connection to that layer, while ohmic contacts 120, formed as a ring on p-type doped section 108, provides electrical connection to that section. An implantation mask 124 is formed on the upper section 108. Optionally, an antireflective (AR) coating 126 for minimizing reflectance in a selected wavelength range is formed on the photodiode 112.

In operation, as photons of light fall incident on the detector 100, they pass through the n-on-p junction of diode 112. As photons pass through the upper semiconducting layers 114 and 108, they generate electron-hole pairs which are separated at the pn junction. As a result, a current is generated across the junction. That current can be sensed between either of terminals 116, which contact layer 114, and either of terminals 120, which contact upper section 108. Once the incident photons pass through the photodiode 112, they strike insulator 102. Photons having a wavelength greater than a selected long wavelength cutoff pass through the insulator layer 102 and are dissipated within the lower section 110 of substrate 106. Photons having a wavelength less than the selected long wavelength cutoff are preferably reflected by the insulator 102 back through the diode 112. Such reflections act to increase the quantum efficiency of the diode 112 at wavelengths less than the selected long wavelength cutoff and increase the electrical output signal sensed at terminals 116 and 122. According to the invention, the thickness of the upper section 108, along with the energy band gap of the material from which the upper section 108 is fabricated determines the long wavelength cutoff and thus, the quantum efficiency of the photodetector 100 at various wavelengths of light.

Figure 2:
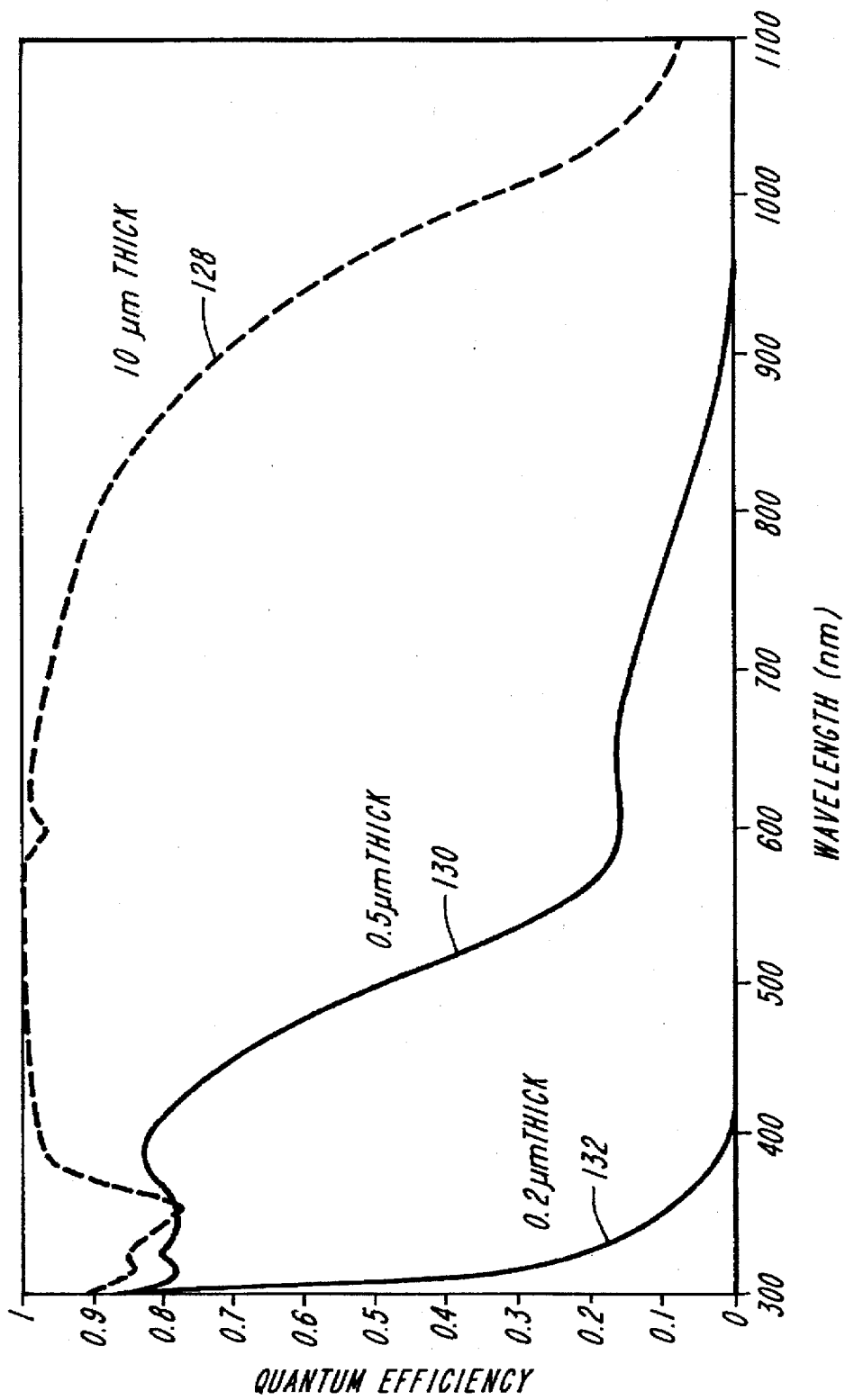
FIG. 2 shows a comparison of quantum efficiency as a function of wavelength between several wavelength selective photodetectors fabricated in accordance with the present invention.

FIG. 2 shows a comparison of spectral quantum efficiencies at various wavelengths between several photodetectors fabricated in accord with the embodiment of FIG. 1, but with differing upper section 108 thicknesses. For example, curve 128 illustrates that an upper section 108 fabricated from Si and having a thickness of 10 μm provides a long wavelength cutoff in the approximate range of 900 nm–1000 nm (near infrared or NIR). Alternatively, curve 130 shows that an upper section 108 fabricated from Si and having a thickness of 5000 Å provides a long wavelength cutoff in the approximate range of 500 nm–600 nm (visible). As shown by curve 132, an upper section 108 fabricated from Si and having a thickness of less than 2000 Å provides a long wavelength cutoff of less than about 400 nm (UV).

Figure 3:
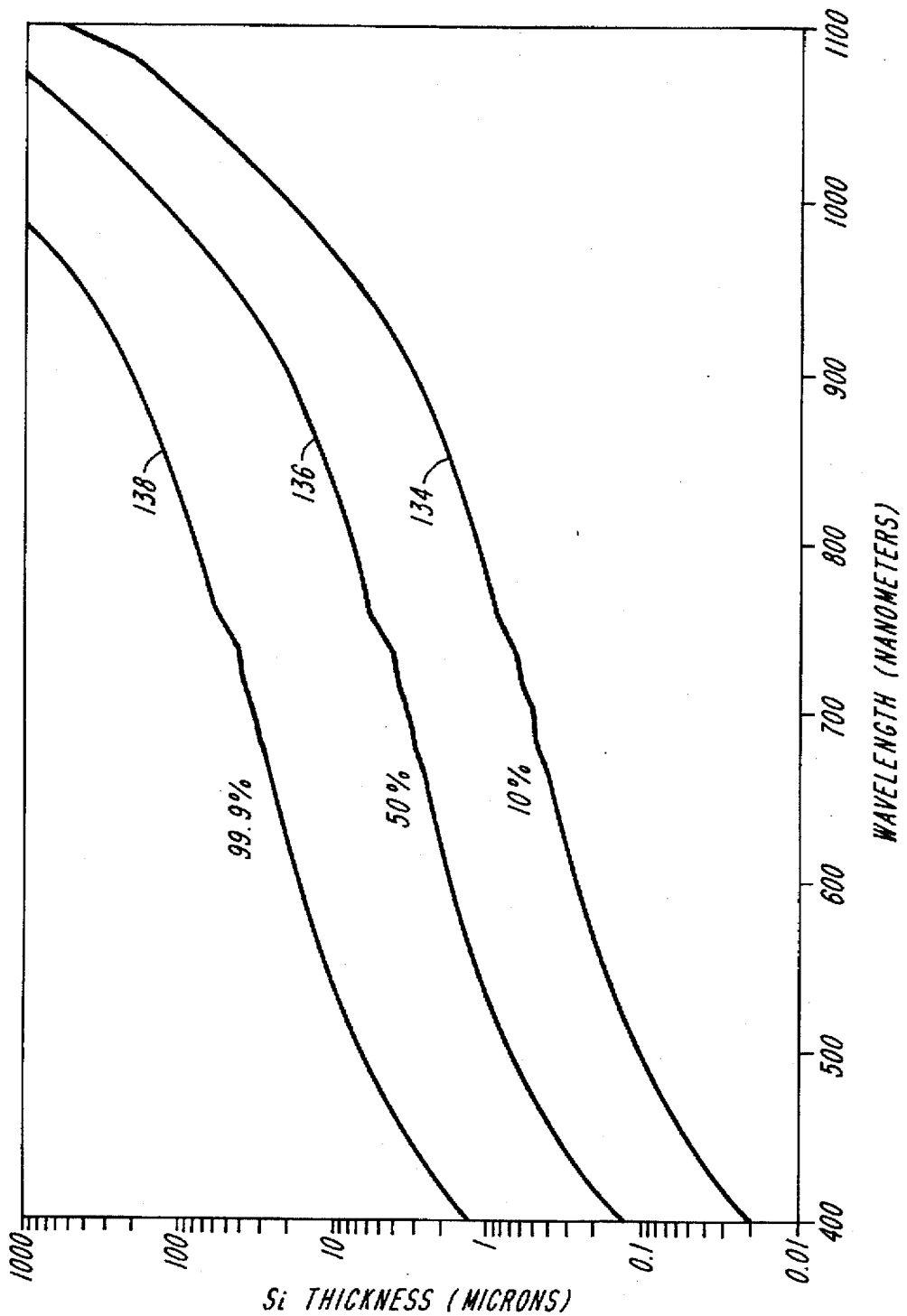
FIG. 3 depicts the relationship between the thickness of silicon and the wavelength of light that it absorbs.

FIG. 3 shows a series of curves 134, 136 and 138 indicating the thickness of Si required to absorb differing percentages of incident light. As can be seen, an upper section 108 having a thickness of approximately 500 nm will absorb between 50% and 99.9% of the incident light having a wavelength less than 400 nm (see curve 138). Alternatively, it will absorb less than 50% of the incident light having a wavelength greater than about 475 nm (see curve 136) and less than 10% of the incident light having a wavelength greater than about 675 nm (see curve 134). Based on the data of FIGS. 2 and 3, a wavelength selective photodetector of the type depicted in FIG. 1 and having a Si upper section 108 with a thickness of about 500 Å would be quite sensitive in the UV wavelength range, while having insignificant visible and IR sensitivity.

Figure 4A:
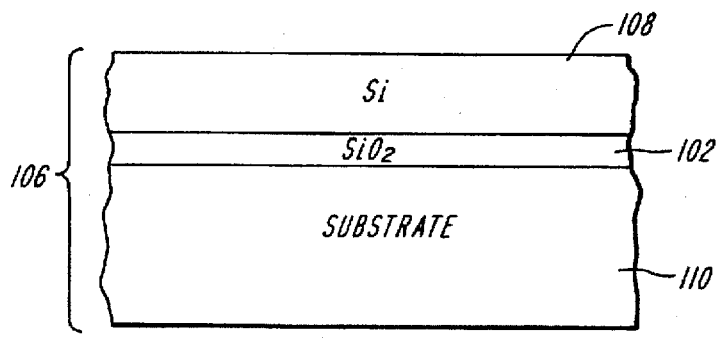
FIGS. 4A–4F depict abridged processing steps for fabricating a wavelength selective photodetector of the type shown in FIG. 1.

FIGS. 4A–4F illustrate one preferred process by which a wavelength selective photodetector of the type depicted in FIG. 1 can be fabricated. Like components shown in FIG. 1 and FIGS. 4A–4F are depicted with like reference designations. As illustrated in FIG. 4A, a buried insulator 102 is formed at a predetermined depth in a Si substrate 106. The buried insulator layer 102 divides the substrate 106 into an upper section 108 and a lower section 110. The buried insulator layer 102 is preferably formed by a separation by implantation of oxygen (SIMOX) process. However, other SOI materials can also be used to fabricate the devices of the invention. Such other materials include, but are not limited to, bonded and etch-back SOI (BESOI) substrates, zone-melting recrystallization (ZMR) substrates, and silicon on sapphire (SOS) substrates.

SIMOX devices have the advantage of being inherently radiation hard, and thus are suitable for space applications. More specifically, SIMOX detectors have superior resistance against damage from protons and alpha particles. After irradiation with a proton fluence of $1\times10^{11}$ p/cm² at 1.45 MeV, significant degradation in the performance of bulk Si devices occurs, while SIMOX devices are substantially unaffected. Additionally, the increase in dark leakage current of bulk Si devices, after irradiation with an alpha fluence of $8\times10^{11}$ α/cm², is about ten times greater than that which occurs in SIMOX counterparts.

According to the invention, a plurality of SIMOX processes can be employed to fabricate the buried insulator layer 102. Examples of those processes include high dose, high energy, single implant SIMOX; high dose, high energy, multiple implant SIMOX; and low dose, low energy implant SIMOX. In the high dose, high energy, single implant process, the substrate 108 is implanted with a dose of $1.8\times10^{18}$ O⁺/cm² at an energy of 200 KeV, followed by annealing for six hours at approximately 1300° C. in nitrogen (N₂). The resulting SIMOX structure has a Si top section 108 having a thickness of about 2000 Å and a buried SiO₂ insulator layer 102 having a thickness of about 4000 Å. Such a structure yields a relatively low response to visible and IR photons, while efficiently detecting UV photons having wavelengths near 310 nm. Additionally, the Si top section 108 can be increased by growing additional Si epitaxially by chemical vapor deposition (CVD), or decreased by thermal oxidation of the layer, followed by etching in buffered HF.

In the high dose, high energy, multiple implant process, instead of a single high dose oxygen implantation, three smaller oxygen doses, typically of 0.5, 0.5, and $0.8\times10^{18}$ O⁺/cm² are implanted sequentially into the substrate 106, followed by a high temperature anneal (typically at 1300° C. in N₂) after each implantation step. A primary advantage of the multiple implant process is that it usually yields a Si top section 108 with a lower threading dislocation density and a buried oxide layer of better quality than the single implant process. However, due to the additional processing, it is more expensive.

In the low energy SIMOX (LES) process, an oxygen dose of about 0.4 to $0.7\times10^{18}$ O⁺/cm² is implanted at an energy of between about 20 KeV and about 80 KeV to form an SOI structure with a Si top section 108 thickness on the order of about 200 Å to about 1000 Å. Low dose, low energy implantation is more cost effective than high dose, high energy SIMOX processes and offers some technical advantages. It is more cost effective than other SIMOX processes because implantation time is reduced and also because low energy ion implanters are less expensive than high energy models. One technical advantage is that the low dose implantation creates less damage to the original substrate 106 and thus, can produce a higher quality top section 108.

Figure 4B:
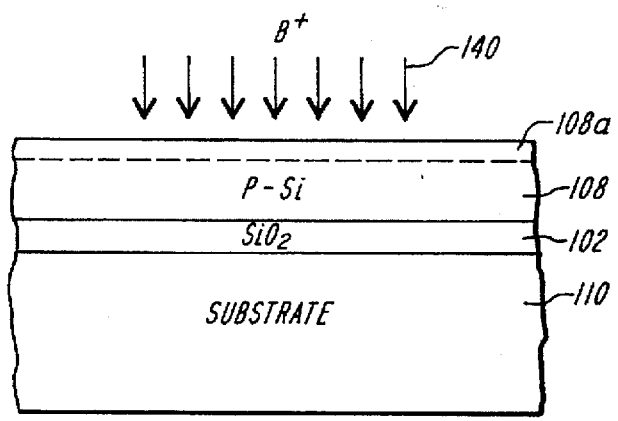

As shown in FIG. 4B, subsequent to preparing the substrate 106 in accord with the particular SIMOX process of FIG. 4A, it is implanted with a dose of boron (B) atoms 140 of approximately $2\times10^{13}$ B⁺/cm² at about 30 KeV to render the Si top section 108 p-type. The substrate 106 is then annealed for twenty-five minutes at 9000° C. in N₂ to recrystallize the Si upper section 108 and to activate the p-type dopant. The implantation followed by annealing process yields an upper section 108 having a highly p-type doped top section 108a.

Figure 4C:
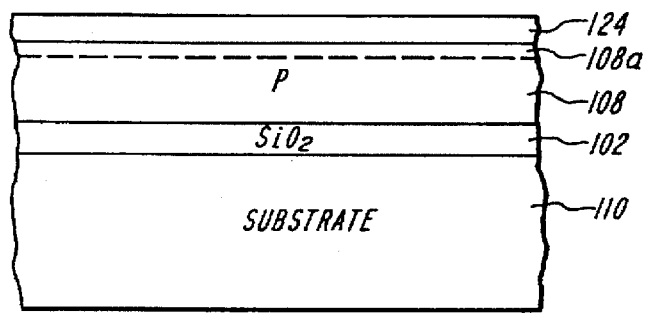
Figure 4D:
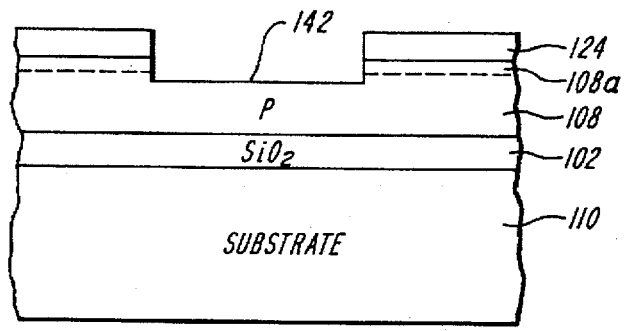
Figure 4E:
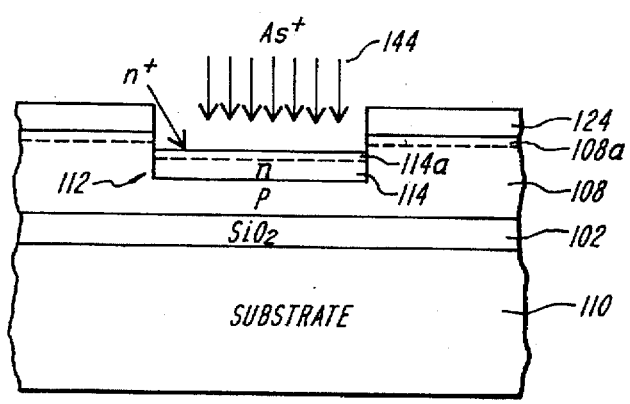

Next, as shown in FIG. 4C, a layer 124 of Si₃N₄ about 6000 Å thick is deposited as an implantation mask onto the substrate 106. Preferably, the mask 124 is deposited using ion beam assisted deposition (IBAD). As shown in FIG. 4D, the substrate 106 is then patterned using standard photolithographic techniques to remove mask 124 and highly p-type doped top portion 108a from a selected region 142 to expose the p-type doped Si upper section 108. As illustrated in FIG. 4E, the photodiode 112 is then fabricated by forming a shallow n-on-p junction between upper section 108 and layer 114 by implanting arsenic (As) ions 144 at a dose of $1 \times 10^{15}$ As$^+$/cm$^2$ at 40 KeV. Following implantation, the substrate 106 is annealed at 950° C. for thirty minutes in N$_2$, again to recrystallize the material and activate the dopants. The semiconductor junction between layer 114 and section 108 is preferably located less than 500 Å below the surface of upper section 108. The implantation followed by annealing process yields an n-type doped layer 114 having a highly n-type doped top portion 114a. In addition, an SiO$_2$ layer about 100 Å thick is grown thermally to passivate the surface.

Figure 4F:
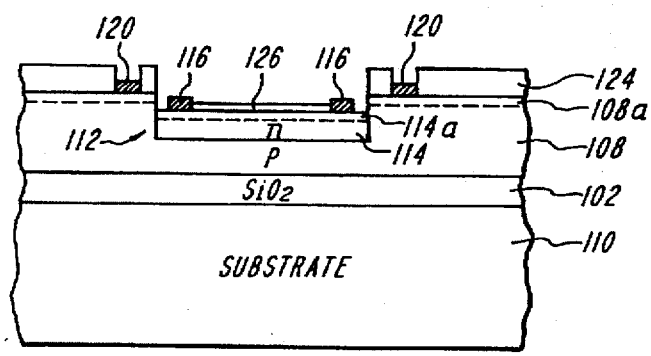

During fabrication, the formation of the n-on-p junction of the photodiode 112 can be verified by techniques such as hot-point probing, four-point probing and staining of the semiconductor junction. Following verification of the formation of the semiconductor junction, and as shown in FIG. 4F, the substrate 106 is patterned photolithographically a second time and windows to the ohmic contact regions 114a and 108a are opened. Using an e-beam evaporator, the contacts 116 and 120 are formed by initially depositing a Ti layer about 500 Å thick, followed by 500 Å of Pd, followed by 5000 Å of Au on the ohmic contact regions. The use of Ti insures adhesion to the Si, while the Au layer on top provides ideal oxidation-resistant contact pads for bonding. Pd is used as a bridge between the Au and Ti.

According to a further embodiment of the invention, and as shown in FIGS. 1 and 4F, the photodetector 100 can include an anti-reflection (AR) coating 126 to minimize reflection loss and to improve the detector's responsivity in the desire case of a range. In the case of a UV selective photodetector 100, an AR coating 126 which minimizes the reflectance for photons having wavelengths shorter than 350 nm can be selected. In selecting an appropriate AR coating 126, competing factors should be weighed. By way of example, for a UV selective detector 100, the AR coating 126 should reduce the amount of light reflected from the detector at wavelengths shorter than 350 nm, but should not have an energy band gap so small that it absorbs a significant portion of the UV photons, before they reach the photodiode 112.

More specifically, testing has shown that a UV selective detector with a 2000 Å thick Si upper section 108 and a 4000 Å thick buried SiO$_2$ layer 102 on a Si substrate 110, without any AR coating, reflects over 60% of the incident light having wavelengths less than 350 nm. However, an AR coating 126 of a 500 Å thick layer of SiO$_2$ provides a reduction in reflectance of UV photons of about a factor of two. In contrast, an AR coating 126 formed from a 314 Å thick layer of Si$_3$N$_4$ reduces the reflectance at UV wavelengths to less than 10%. Alternatively, a 314 Å thick layer of ZnS reduces the reflectance at UV wavelengths to almost zero. However, because the energy band gap of ZnS is relatively small (about 3.7 eV) as compared to Si$_3$N$_4$ (about 5 eV) and SiO$_2$ (about 9 eV), much of the incident UV light is absorbed by a ZnS layer before it reaches the photodiode 112.

Consequently, according to one embodiment of a UV selective photodetector according to the invention, the AR coating 126 is fabricated from a double layer consisting of a 240 Å thick layer of Si$_3$N$_4$ on a 75 Å thick layer of SiO$_2$. Such a structure provides a reflectance at UV wavelengths of less than 10%, while not absorbing a significant amount of the incident light. Preferably, the SiO$_2$ layer is grown thermally on layer 114 by dry oxidation in a tube furnace, followed by deposition of the Si$_3$N$_4$ layer using plasma assisted chemical vapor deposition (PA-CVD). However, according to further embodiments, AR coatings formed from one or more layers SiO, SiO$_2$, ZnS, Si$_3$N$_4$, TiO$_2$, Ta$_2$O$_5$, SiC and/or MgF can be employed.

FIGS. 5A–5E depict an alternative process for fabricating a wavelength selective photodetector 100 according to the invention. Elements in FIGS. 5A–5E which have counterpart elements in FIGS. 4A–4F are denoted with a prime (') in those figures. As in the case of the process of FIG. 4A, a SIMOX process is employed in FIG. 5A to form a buried SiO$_2$ insulator layer 102' in a substrate 106'. However, prior to implanting the boron ions 140' to render the upper section 108' p-type doped, a thin ion implantation mask 124' of SiO$_2$ about 1500 Å thick is deposited by CVD or grown thermally. Using photolithographic steps, windows are opened in the mask 124' in the ohmic contact regions 146 and 148. Initially, a relatively low dose of boron ($5 \times 10^{12}$ B$^+$/cm$^2$) is implanted at an energy of about 60 KeV. Under this condition, the boron ions are distributed well within the upper section 108', with the peak concentration near the buried SiO$_2$ interface, while the Si near the surface is very lightly doped. Next, preferably without removing the substrate 106' from the implanter, the ion implantation energy is reduced to 10 KeV and implantation is continued with a higher dose of boron ($5 \times 10^{13}$ B$^+$/cm$^2$). Due to the low implantation energy, the distribution profile of the second implant is shallow (about 800 Å) and dopes the ohmic contact regions 147 and 149, which have been exposed through the mask 124', forming highly-doped p$^+$ regions ideal for low-resistance ohmic contact formation. After boron implantation, the masking 124' is removed and the substrate 106' is prepared for formation of n-type doped layer 114', shown in FIG. 5C.

Figure 5A:
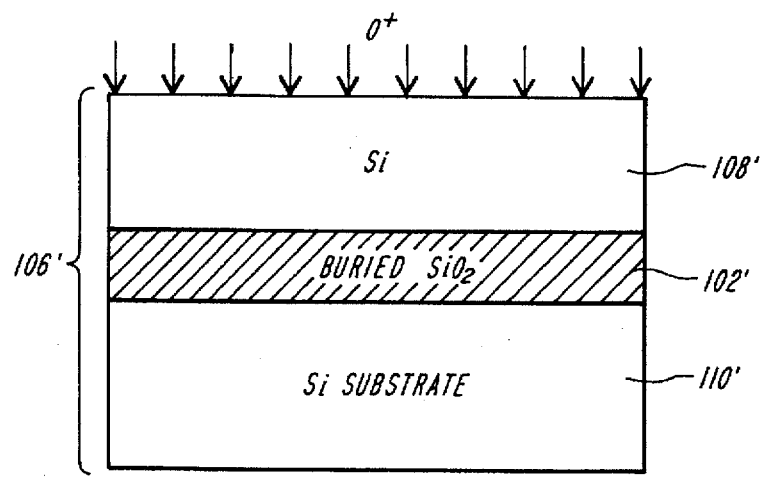
Figure 5B:
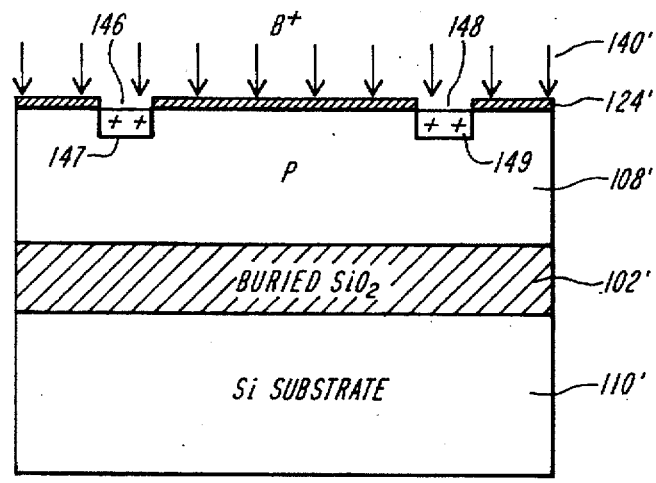
Figure 5C:
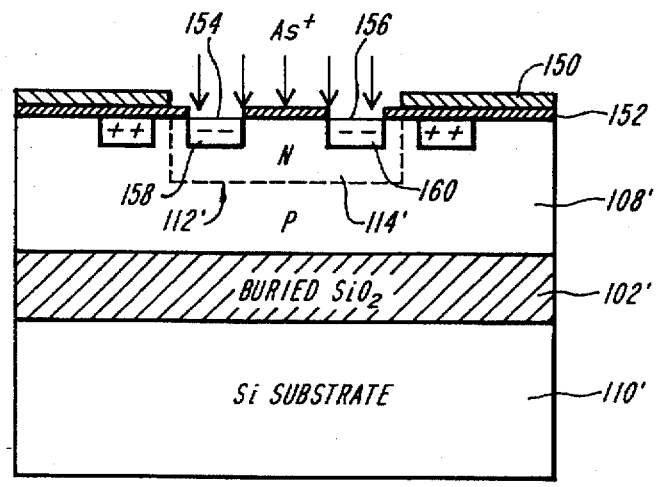

With further reference to FIG. 5C, the substrate 106' is masked with a relatively thick layer 150 of SiO$_2$ (>5000 Å thick) to mask the outside portion of the p-type upper section 108', which surrounds the active region of the photodiode 112'. A thinner (about 200 Å) layer 152 of SiO$_2$, with opened windows 154 and 156 is formed over the active region 112'. Arsenic donor ions are initially implanted with a dose of about $5 \times 10^{14}$ As$^+$/cm$^2$ at 40 KeV. Accordingly, the distribution range of this implant is only about 550 Å (200 Å in the masking oxide) with a peak about 150 Å below the surface of section 108' in the area 114'. After the formation of the n-well 114', the implantation energy is reduced to 15 KeV and a dose of $1 \times 10^{15}$ As$^+$/cm$^2$ is implanted to form highly-doped n$^+$ regions 158 and 160 for ohmic contacts.

Following implantation, the mask 150 is removed. However, the mask 152 can be left as a passivating layer to improve device performance. Additionally, metal contacts 116' and 120' can be formed in the same way, described above with respect to FIGS. 4A–4F. An AR coating of the type described above can also be included.

FIGS. 6A and 6B depict wavelength selective photodetectors 162 and 164, respectively, having alternative photodiode junction configurations. More particularly, in the embodiments of FIGS. 1, 4A–4F and 5A–5E, the photodiodes 112 and 112' have a vertical n-on-p junction configuration. Alternatively, FIG. 6A depicts a p-intrinsic-n (PIN) horizontal junction and FIG. 6B depicts a p$^+$pnn$^+$ horizontal junction. However, according to a preferred embodiment, a vertical junction of the type depicted in FIGS. 1, 4A–4F and 5A–5E is employed by the invention.

Figure 7:
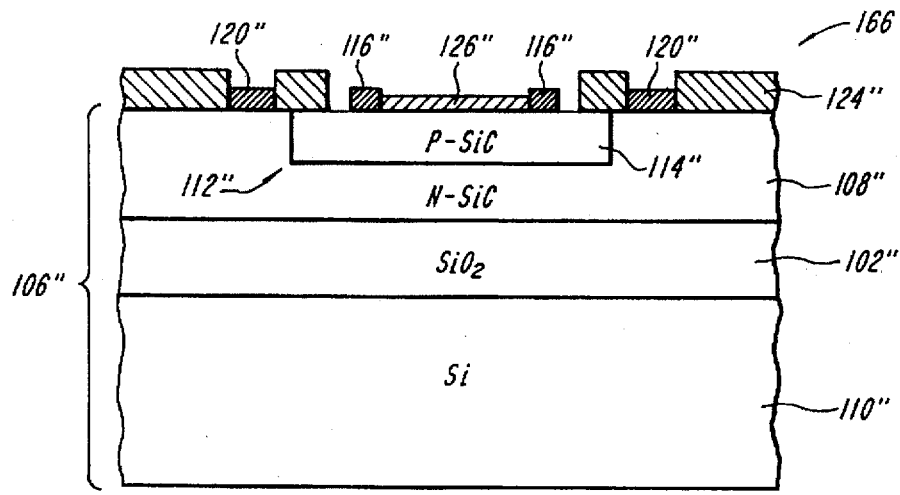
FIG. 7 is a cross sectional view of an alternative embodiment of the invention employing SiC in the upper section of the wavelength selective photodetector of FIG. 1.

FIG. 7 shows a cross sectional view of a wavelength selective photodetector 166, which employs an upper section 108" of SiC according to an alternative embodiment of the invention. As discussed above, two important factors in determining the long wavelength cutoff is the thickness of the upper section 108" and the energy band gap of the material from which it is formed. More particularly, the energy band gap of the top section material determines the maximum thickness of the top section 108" for any particular long wavelength cutoff. For example, as illustrated in FIG. 2, to achieve a long wavelength cutoff in the approximate range of 500 nm–600 nm with Si the top layer should be less than about 5000 Å thick (see curve 130). However, since the energy band gap of SiC (2.2 eV) is twice that of Si (1.1 eV), a SiC top layer that achieves the same long wavelength cutoff can expectedly be considerably thicker. As a result of the increased top section thickness, a photodetector with a particular long wavelength cutoff is easier to fabricate with a thick SiC top section rather than with a thin Si top section.

As can be seen, the photodetector 166 of FIG. 7 is constructed in a similar fashion to the photodetector 100 of FIG. 1. Accordingly, elements in FIG. 7 which have counterpart elements in FIG. 1 are denoted with a double prime ("). By way of example, the detector 166 includes a buried insulator layer 102", preferably formed from $SiO_2$, which divides the substrate 106" into a relatively thin upper section 108" formed of SiC and a relatively thick lower section 110" formed of Si. The depth to which the buried layer is implanted determines the thickness of the upper section 108". A photodiode 112" is fabricated on the upper section 108". Unlike the device of FIG. 1, the depicted upper section 108" is n-type doped and the photodiode 112" has a p-type doped layer 114" formed on the n-type doped upper section 108". However, according to an alternate embodiment, the photodiode 112" can be fabricated as an n-on-p device. Accordingly to that embodiment, the n-type dopant is preferably phosphorous or nitrogen and the p-type dopant is preferably aluminum or boron. Ohmic contact 116" provides electrical connection to the p-type doped layer 114", while ohmic contact 120" provides electrical connection to the n-type doped section 108". An implantation mask 124" is formed on the upper section 108". Optionally, an antireflective (AR) coating 126" for minimizing reflectance in a selected wavelength range is formed on the photodiode 112".

Figure 8A:
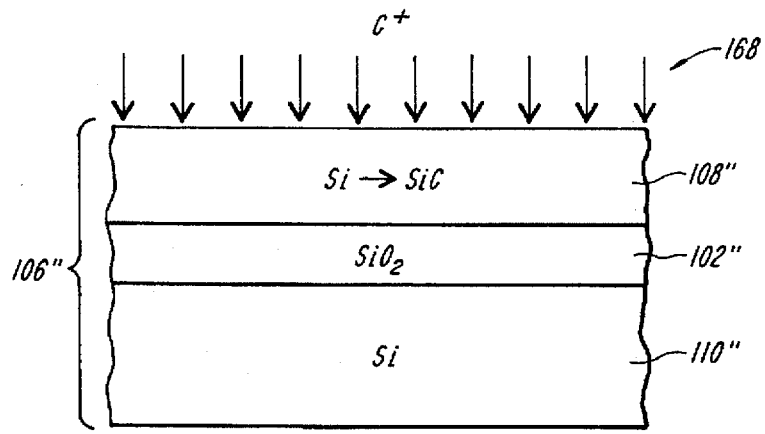
FIGS. 8A–8D depict abridged processing steps for fabricating a wavelength selective photodetector of the type shown in FIG. 7.
Figure 8B:
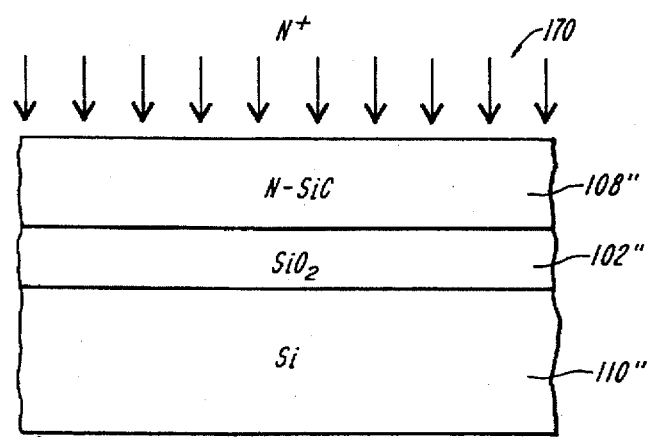
Figure 8C:
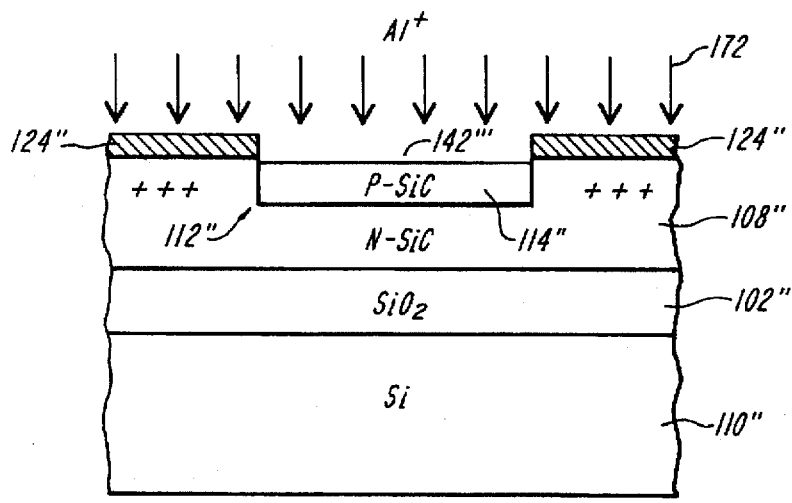
Figure 8D:
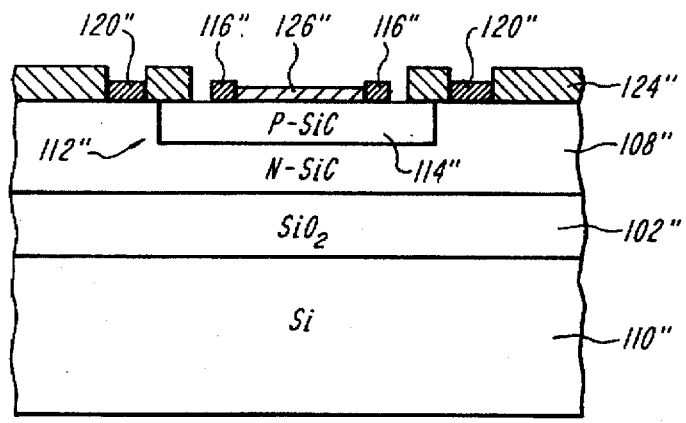

FIGS. 8A–8D depict an abridged process for fabricating a wavelength selective photodetector 166 of the type shown in FIG. 7. As shown in FIG. 8C, buried insulator layer 102" is formed in substrate 106" in the same fashion as insulator 102 of FIG. 4C is formed in substrate 106. Following formation of insulator layer 102", carbon (C) 168 is implanted into the Si upper section 108" to transform it into a SiC upper section. Carbon doses range from about $5 \times 10^{17}$ $C^+/cm^2$ to about $2 \times 10^{18}$ $C^+/cm^2$ at multiple energies of 25, 50, 75 and 100 KeV, to create a substantially uniform ion distribution profile across the upper section 108". To ensure formation of SiC at the surface, the $C^+$ ions are implanted at a shallow angle up to about 14° from the normal. Following carbon implantation, the substrate 106" is annealed at a temperature of about 1300° C. in flowing $N_2$ for period of between one and ten hours. This solid-phase-epitaxy (SPE) regrowth acts to remove any implantation-induced damage and forms a continuous crystalline SiC layer 108". At these elevated temperatures, the buffed amorphous $SiO_2$ layer 102" softens slightly. Such softening is beneficial in accommodating the strain resulting from lattice mismatch between SiC and Si, and thus preventing the nucleation of defects at the interface between section 108" and layer 102". The SiC upper layer may also be formed by means other than carbon implantation. One of the well-known methods of doing this is by carbonizing a Si layer at high temperature by passing a carbon-containing gas over it, or by chemical vapor deposition.

As shown in FIG. 8B, by implanting nitrogen donor ions 170 and annealing, the SiC upper section 108" is n-type doped. Following the n-type doping, as shown in FIG. 8C, an implantation mask 124" of $SiO_2$ having a thickness of about 3000 Å to about 5000 Å is deposited on upper section 108" by CVD. Next, the device is photolithographically patterned and a window 142" is opened in layer 124" by buffered-HF etching. The upper section 108" is then implanted with aluminum (Al) acceptor ions 172 to form a p-type doped SiC well 114" in the area exposed by window 142". Subsequently, the device is annealed for about thirty minutes at about 900° C. to remove implantation damage and to activate the dopants. Once again, the device is photolithographically patterned to open ohmic contact regions to the p-type 114" and n-type 108" SiC regions. Using e-beam evaporation, 500 Å of Ti, 500 Å of Pd, followed by 5000 Å of Ag is deposited in the ohmic contact regions in the same fashion as in FIG. 4F. An AR coating 126" of the type discussed with respect to FIG. 4F can also be employed.

Figure 9A:
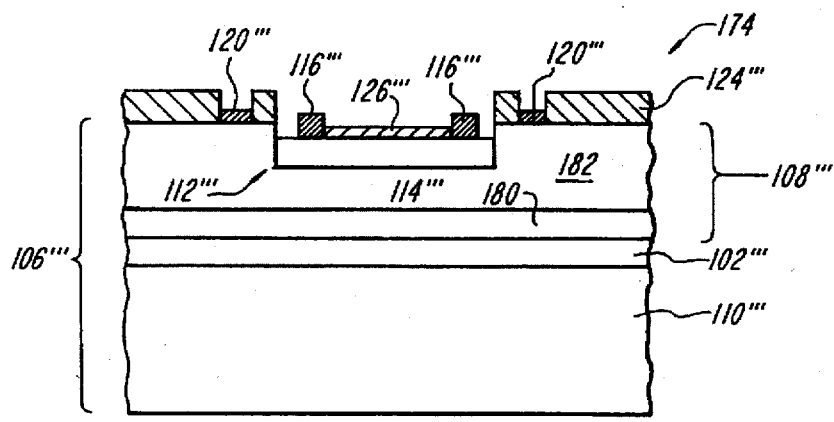
FIGS. 9A–9C are cross sectional views of an alternative embodiment of the invention employing a dual layer structure in the upper section of the wavelength selective photodetector of FIG. 1.
Figure 9B:
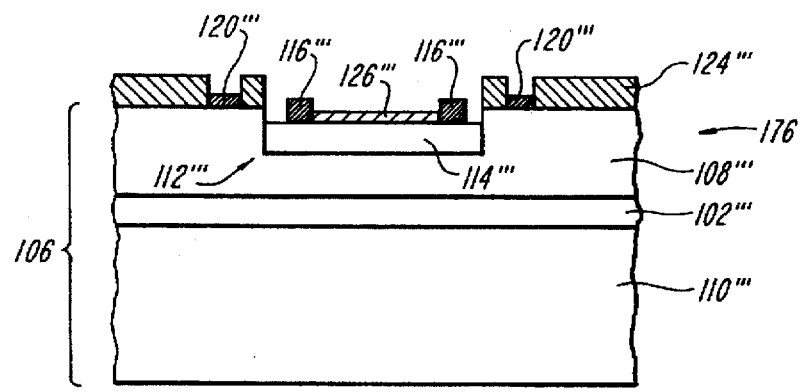
Figure 9C:
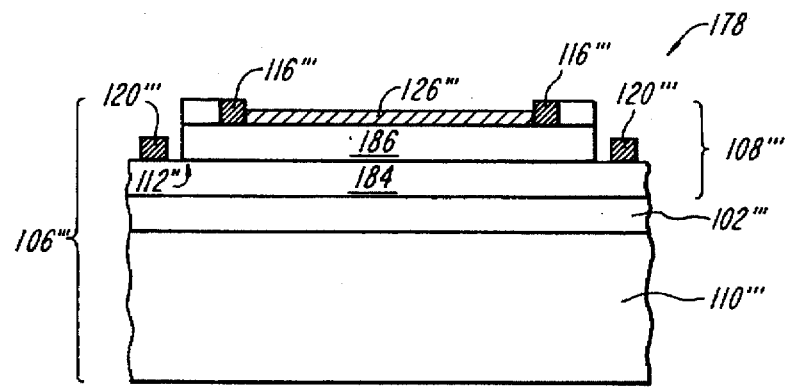

FIGS. 9A–9C depict alternative embodiments of the invention, in which the upper section 108 of FIG. 1 is fabricated as a dual layer structure. Elements in FIGS. 9A–9C which have counterpart elements in FIG. 1 are denoted with a triple prime ("'). By way of example, FIGS. 9A–9C show cross sectional views of a wavelength selective photodetector 174, 176 and 178, respectively. As in the case of detector 100 of FIG. 1, detectors 174, 176 and 178 have a buried insulator layer 102"', preferably of $SiO_2$, formed at a selected depth within a substrate 106"'. The buried layer 102"' divides the substrate into an upper section 108"' and lower section 110"'. However unlike the detector 100 of FIG. 1, the detectors 174, 176 and 178 all employ a dual composition upper section 108"'.

By way of example, upper section 108"' of detector 174 has a bottom layer 180, preferably of Si, and a top layer 182, preferably of SiC. In one preferred embodiment, the SiC layer 182 is between about 250 Å and about 2000 Å thick, and the Si layer 180 is between about 100 Å and about 1000 Å thick. As in the case of photodetector 166 of FIG. 7, the SiC layer 182 is preferably n-type doped with N. The photodiode 112"' is formed as a homojunction within the SiC layer 182. Thus, photodiode 112"' has a p-type doped layer 114"' (preferably doped with aluminum) formed on the n-type doped layer 182. Ohmic contacts 116"' provide electrical connection to the p-type doped layer 114"', while ohmic contacts 120"' provide electrical connection to the n-type doped section 182. An implantation mask 124"' is formed on the top layer 182. Optionally, an antireflective (AR) coating 126"' for minimizing reflectance in a selected wavelength range is formed on the photodiode 112"'.

In contrast to the photodiode of FIG. 9A, the photodiodes 112"' of FIGS. 9B and 9C are fabricated as a heterojunctions. For example, in FIG. 9B, upper section 108"' is formed from Si and layer 114"' is formed from SiC. The junction formed between layer 114"' and section 108"' can be fabricated to be either n-on-p or p-on-n. Electrical connection to the layer 114"' and section 118"' is achieved through contacts 116"'–122"', as described with respect to FIG. 1. FIG. 9C shows an alliterative construction for achieving a heterojunction in which the upper section 108"' includes a bottom layer 184, preferably of Si, and a top layer 186, preferably of SiC. The top layer 186 can be etched away at the periphery to provide for ohmic contacts 120'". Alternatively, layer 186 can be fabricated as an island on layer 184. As in the case of the embodiment of FIG. 9B, the photodiode 112'" can either be formed with an n-on-p or a p-on-n semiconductor junction.

Figure 10:
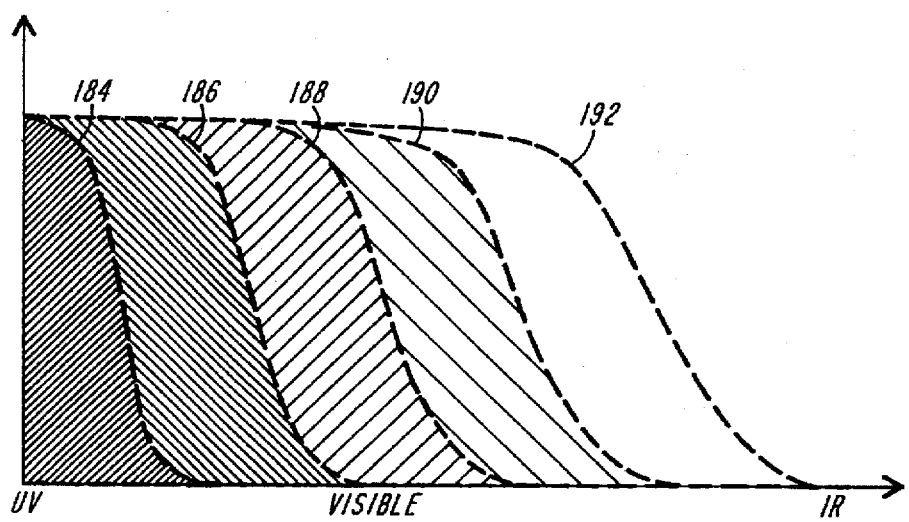
FIG. 10 is a graph representative of the integrated spectral response of an array of wavelength selective photodetectors.

In a further embodiment of the invention, a plurality of wavelength selective photodetectors, of the type discussed above, but having different long wavelength cutoffs can be combined to form a photodetector array. FIG. 10 depicts an integrated spectral response, including exemplary long wavelength cutoff curves 184–192 for five photodetectors included in such an array.

Figure 11:
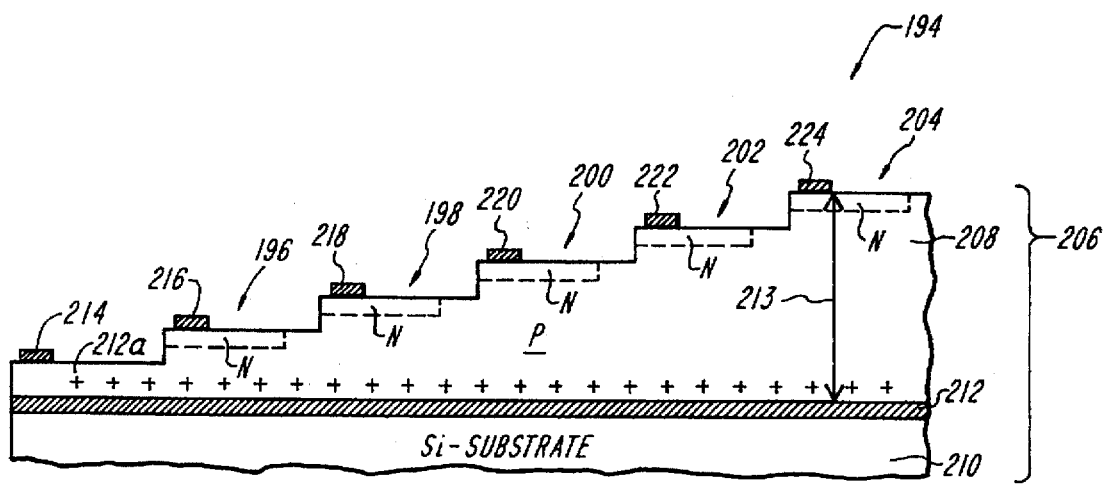
FIG. 11 is conceptual schematic of an array of photodetectors according to an alternative embodiment of the invention.

FIG. 11 shows a conceptual schematic of a filterless and gratingless photodetector array 194 having a spectral response of the type depicted in FIG. 10. As can be seen, the array 194 includes five wavelength selective photodetectors 196–204 with varying long wavelength cutoffs. As in the case of the photodetectors discussed above, each of the detectors 196–204 include photodiodes formed on a substrate 206, wherein the substrate is divided into a relatively thin upper section 208 and a relatively thick lower section 210 by an insulator layer 212. According to a preferred embodiment of the invention, the wavelength selectivity of the photodetectors 196–204 is realized by varying the thickness 213 and/or material composition of the top section 208. According to a further embodiment, a logic circuit or processor can be fabricated monolithically with the array for deconvolving electrical output signals from electrical output terminals 214–224 of the array 194 to identify particular wavelengths of incident photons.

According to one preferred embodiment of the invention, the array 194 is fabricated as a three detector array and has a silicon upper section 208. A first photodetector in the array has an upper section thickness of between about 500 Å and about 2000 Å, and detects UV photons having a wavelength up to about 400 nm. A second photodetector has an upper section thickness of between about 3000 Å and about 6000 Å and detects UV and visible photons having a wavelength shorter than about 600 nm, while being relatively insensitive to IR photons. The third detector has an upper section thickness of between about 7000 Å and about 10000 Å and detects UV, visible and near IR photons with a wavelength up to about 800 nm.

In an alternative embodiment of the invention, the upper section is formed from SiC, as in the case of FIGS. 7 and 8A–8D, and the array is fabricated as a four detector array. The first photodetector has an upper section thickness of between about 500 Å and about 2000 Å, and has a long wavelength cutoff of about 200 nm. The second detector has an upper section thickness of between about 2000 Å and about 4000 Å, with a long wavelength cutoff of about 300 nm. The third detector has an upper section thickness of between about 4000 Å and about 6000 Å for a long wavelength cutoff of about 400 nm, and the fourth detector has an upper section thickness greater than about 2 µm, yielding a long wavelength cutoff of about 600 nm.

According to another embodiment of the invention, the upper section of each detector in the array is fabricated as a dual layer upper section. As in the case of FIGS. 9A–9C, the top layer of the upper section is preferably SiC and the bottom layer of the upper section is preferably Si. By way of example, such a detector array can be configured as a five detector array having long wavelength cutoffs at about 200 nm, 300 nm, 400 nm, 600 nm and 800 nm. According to one embodiment, to achieve a cutoff of about 200 nm, the bottom (Si) layer has a thickness of between about 100 Å and about 1000 Å and the top (SIC) layer has a thickness of between about 5000 Å and about 2000 Å. For a cutoff of 300 nm, the bottom layer has a thickness of between about 100 Å and about 1000 Å and the top layer has a thickness of between about 1000 Å and about 3000 Å. For a cutoff of 400 nm, the bottom layer has a thickness of between 100 Å and 1000 Å and the top layer has a thickness of between about 2000 Å and about 6000 Å. For a cutoff of 600 nm, the bottom layer has a thickness between about 1000 Å and about 2000 Å and the top layer has a thickness between about 6000 Å and about 8000 Å. To achieve a cutoff of about 800 nm, both the top and bottom layers have thicknesses of between about 1 µm and about 2 µm.

FIGS. 12A–12D depict abridged processing steps for fabricating an array of photodetectors such as that conceptually shown in FIG. 11. Elements in FIGS. 12A–12D which have counterpart elements in FIG. 11 are denoted with a prime ('). By way of example, according to the embodiment of FIG. 12A, a SIMOX process is employed to form a buried insulator layer 212' in a substrate 206'. The insulator layer 212' divides the substrate 206' into a relatively thin upper section 208' and a relatively thick lower section 210'. According to one embodiment, the upper section 208' is fabricated to be about 2000 Å thick and is separated from the lower section 210' by an $SiO_2$ insulating layer 212' having a thickness of about 4000 Å. This structure is produced, preferably by implanting a total oxygen dose of about $1.8 \times 10^{18}$ $O^+/cm^2$ at an energy of 200 KeV into Si(100) substrates, followed by a six hour anneal at about 1300° C. in $N_2$ or argon ambient.

As discussed above, a three element photodiode array in which one detector 196' senses wavelengths below about 400 nm (UV), while the other two detectors 198' and 200' have long wavelength cutoffs at about 600 nm (visible) and at 800 nm (near IR) is fabricated on the above formed SOI structure. However, the 2000 Å thick Si upper section 208' is too thin for absorbing visible or near IR photons. Thus, according to the invention, the thickness of a portion of the upper section can be increased by growing epitaxially between about 1 µm and 20 µm of additional Si by chemical vapor deposition (CVD). To grow high quality Si epitaxial layers, the surface of section 208' is cleaned using a hydrogen bake at a temperature of about 1000° C. Next, Si is deposited onto section 208' from a source gas, such as silane ($SiH_4$), at a temperature near 1100° C., with a growth rate of about 0.7 µm/minute. During the growth process, the Si is doped with boron in a concentration range of between about $1 \times 10^{15}/cm^3$ and about $1 \times 10^{20}/cm^3$, using diborane ($B_2H_6$) gas, to render the upper section 208' p-type. The preferred doping profile forms a very thin ($\approx 1000$ Å) highly doped ($>1 \times 10^{18}$ $B^+/cm^3$) Si layer 208a' near the buried oxide layer 212', which can be used as the common contact for all of the photodiodes of the array. In contrast, the upper portion of the upper section 208' is a moderately doped p-type material with a carrier concentration of about $1 \times 10^{15}$ $B^+/cm^3$.

Figure 12A:
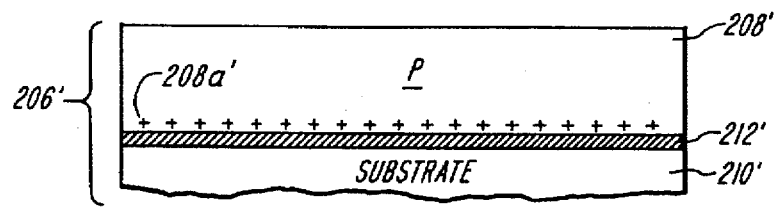
FIGS. 12A–12D depict abridged processing steps for fabricating an array of photodetectors such as that conceptually shown in FIG. 11.
Figure 12B:
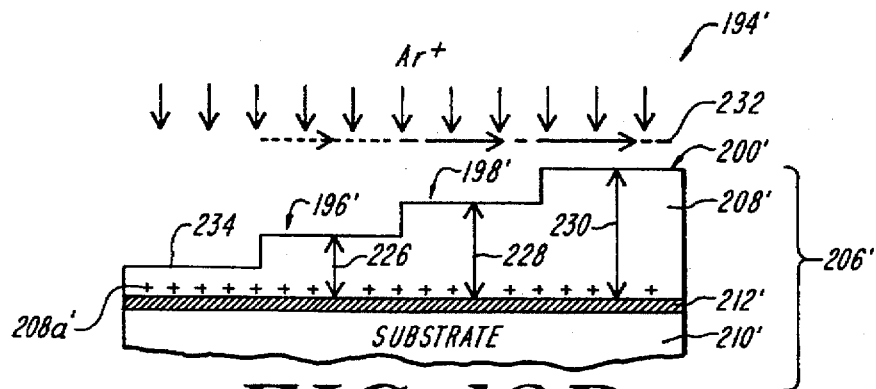

As shown in FIG. 12B, once the p-type Si layer is grown, the substrate 206' is prepared for selective area etching using an RF sputtering machine to define the upper section thickness 226, 228 and 230 for each detector 196', 198' and 200' included in the array 194'. To realize the particular thicknesses 225–230, the upper section 208' is etched anisotropically in an argon ion plasma. Though, for a faster sputtering rate, a reactive ion plasma such as $C_2F_6$ can be used. A physical mask 232 defines the thickness profile, i.e., thicknesses 226–230 for the photodetector array 194'. First, a portion 234 of the upper layer 208' is etched down to the ohmic contact region 208a'. Next, the mask 232 is moved and each of the thicknesses 226–230 are etched. According to a preferred embodiment, thickness 226 is between about 500 Å and about 2000 Å thick, thickness 228 is between about 3000 Å and about 6000 Å thick, and thickness 228 is between 7000 Å and about 10000 Å thick. According to further embodiments, as the desired long wavelength cutoff increases, the thickness 228 is increased.

Figure 12C:
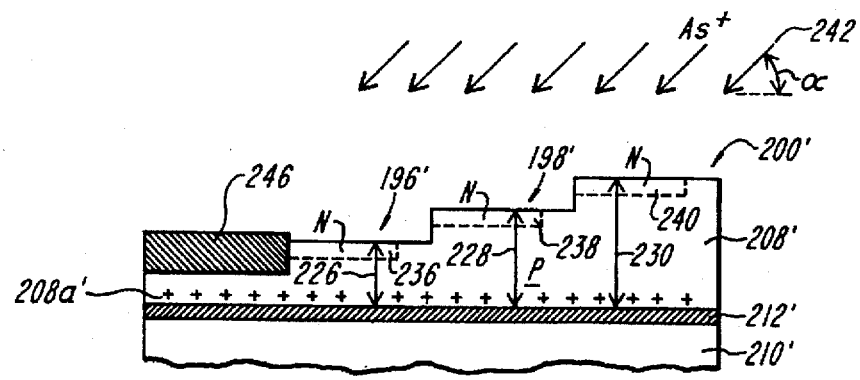

As illustrated in FIG. 12C, donor ions, such as arsenic or phosphorous are implanted, with a concentration in a range of between about $1 \times 10^{16}/cm^3$ and about $1 \times 1^{20}/cm^3$, into the upper section 208' of the detectors 196'–200' to form n-on-p junctions in each detector. An implantation mask 246 shields region 234 from the arsenic or phosphorous ions. In this way, no junction is formed in region 234, where a common contact is formed to all of the detectors 196'–200' in the array. To enable isolation between each of the detectors 196'–200', it is important that the edges of each detector 196'–200' be shielded from donor ions. Otherwise, the n-wells 236–240 will be connected to each other, and the overall structure will be only a single junction device of the type discussed with respect to FIGS. 1–9. To avoid the problem of inadvertently connecting the n-wells 236–240, the donor ions 242 are implanted at an angle $\alpha$, sufficient to result in self masking due to the step-like thickness profile, thus resulting in n-well isolation. Following implantation, the substrate 206' is annealed in $N_2$ at a temperature of about 950° C. for about thirty minutes to remove implantation damage and activate the dopants.

Figure 12D:
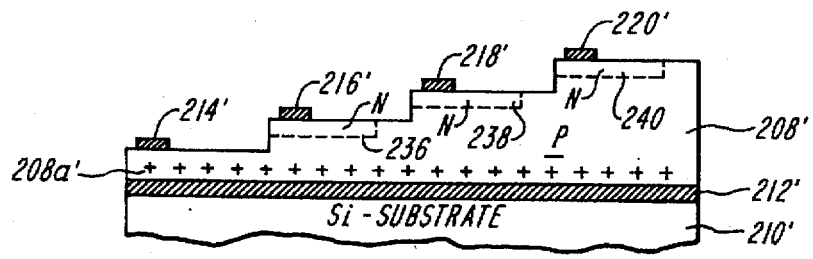

As represented in FIG. 12D by contacts 214'–220', ohmic contacts to both the n and p layers of each photodetector 196'–200' are formed by depositing a layer of about 500 Å of Ti, followed by 500 Å of Pd, followed by 5000 Å of Au, much in the same way as in the case of contacts 116–124 in FIG. 1. Titanium ensures adhesion to Si, while gold makes an ideal oxide-resistant pad for wire bonding, and palladium prevents the interdiffusion of Ti into Au. The metal contact regions can be defined, by way of example, photolithographically or by a physical mask with specific size openings to allow selective area deposition of the metal films. As shown, contacts 216'–220' provide electrical contact to each n-type layer 236–240, while contact 214' provides electrical contact to the common p-type layer 208'.

As in the cases of the previously discussed embodiments, an AR coating, formed from one or more of SiO, $SiO_2$, $Si_3N_4$, ZnS, $TiO_2$, $Ta_2O_5$, SiC and/or MgF can be formed on each of the photodetectors of the array 194' to reduce reflection of photons having wavelengths shorter that the particular long wavelength cutoff for the particular detector.

Although the above discussed wavelength selective array is described in relation to a SOI structure having n-on-p photojunctions, the array 194' can just as well be constructed in accord with the SiC on insulator structure of FIGS. 7 and 8A–8D, or as a silicon on sapphire (SOS) structure. Each of the detectors 196'–200' can also be constructed with a dual layer top section 208' employing either a homo- or heterojunction, as described with respect to FIGS. 9A–9C. Additionally, horizontal junctions, such as those depicted in FIGS. 6A and 6B can also be employed.

Figure 13:
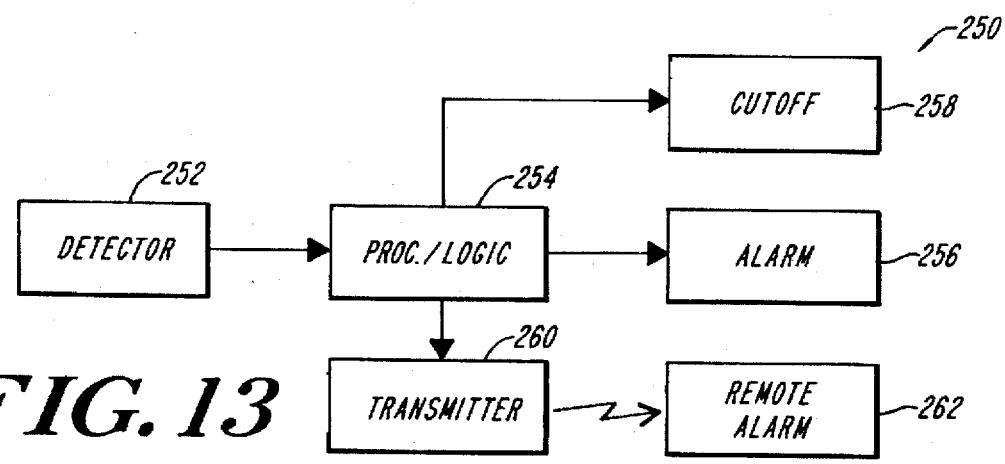
FIG. 13 is a block diagram illustrating the use of a wavelength selective photodetector according to the invention in a multipurpose alarm system.

As mentioned above, wavelength selective photodetectors can be employed in a variety of applications. Such applications can include, for example, alarm/safety applications, and dosimetric applications. FIG. 13 is a general block diagram of an electronic alarm/safety system 250 utilizing a wavelength selective detector 252 according to the present invention. The system 250 includes the wavelength selective detector 252, a processor or logic circuitry 254, and some form of alarm 256. Optionally, the system 250 can also include a safety cutoff 258, a radio transmitter 260 and/or a remote alarm 262. The system 250 can be employed, for example, as a hydrogen flame detector, a hydrocarbon (gas, oil or coal) flame detector, a flame detector in a flammable gas storage facility, a flame-out monitor for aircraft engines, an ignition detection system for rockets.

One application as a hydrocarbon-fuel flame detector involves home heating systems. Home heating furnaces produce a flame which flickers in the visible spectrum, but is constant in the UV. The detector 252 can monitor UV to ensure the flame is always lit. If it detects that the flame has been extinguished, it can signal processor 254, which in turn detects an alarm condition and operates safety cutoff 258 to shut down the flow of fuel to the furnace, thus preventing fuel build up and explosions. Optionally, the processor can also trigger a hard wired alarm 256 or a remote alarm 262 by way of radio transmitter 260. Because of its wavelength sensitivity, detector 252 remains unaffected by the visible part of the flame, room light and sunlight.

In applications such as hydrogen flame detectors and/or safety monitors in a gas storage facilities, the system 250 operates much in the same way as it does in the home heating monitor. The detector 252 detects a flame and signals the processor 254. The processor operates alarms 256 and/or 262 and signals safety cutoff 258. In the case of a hydrogen flame detector, the safety cutoff shuts shut down the hydrogen source. In the case of a gas storage facility, the safety cutoff can be designed to isolate particular gas storage tanks to minimize the chance of explosion.

The military applications for the system 250 are significant. By way of example, when placed on satellites, the detector 252 can detect the UV signal form a ballistic missile, regardless of the interference form visible and IR background. The processor 245 can then signal the radio transmitter 260 to operate a ground based-alarm 262. Alternatively, if mounted on a jet aircraft or a rocket, the detector 252 can be used as a safety device for ignition or flame-out verification. For example, consider the following situation: When an aircraft releases a missile, the missile must accelerate away from the aircraft immediately and not fall behind it. If ignition is delayed, and the aircraft pulls ahead of the missile, the missile could inadvertently lock on to the aircraft. The detector 252 can detect such delayed ignition, and in response, the processor 254 can signal radio transmitter 260 to operate a remote alarm 262 located in the aircraft. In this way, the pilot of the aircraft is rapidly warmed in the case of a delayed ignition.

Figure 14:
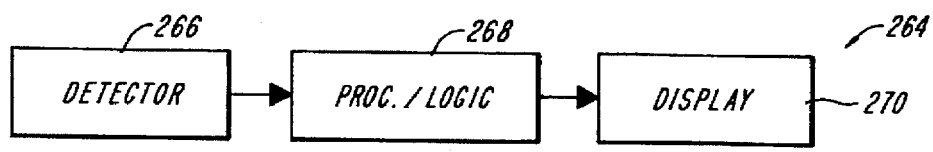
FIG. 14 is a block diagram illustrating the use of a wavelength selective photodetector according to the invention in a multipurpose dosimetric system.

FIG. 14 is a block diagram illustrating the use of a multipurpose dosimetric system 264 which employs a wavelength selective photodetector 266 according to the invention. The system 264 includes the detector 266, a processor/logic circuitry 268 and a display 270. The system 264 can be employed, for example, as an ozone layer monitor, a dosimeter for monitoring UV curing applications, and/or a dosimeter for monitoring exposure to harmful UV emissions. In operation, the detector 266 can be configured to monitor UV emissions and couple and electrical signal indicative of those emissions to the processor/logic circuitry 268. The processor can store and nm software for correlating the UV emission signal from detector 266 to ozone layer thickness, a measurement of sufficient exposure for curing, or a measurement of exposure to harmful UV emissions, depending on the particular application. Alternatively, processor/logic circuitry 268 can be hardwired to provide such correlations.

In this way, the invention attains the objects set forth above and provides a wavelength selective photodetector, which does not require the use of external filters, which is compact and cost effective to manufacture, and which can be employed in a variety of applications, including but not limited to the UV specific applications discussed above.

It is accordingly intended that all matter contained in the above description be interpreted as illustrative rather than in a limiting sense. It is also intended that the following claims cover all of the generic and specific features of the invention as described herein, and all statements of the scope of the invention which, as a matter of language, might be said to fall therebetween.

Having described the invention, what is claimed as new and secured by Letters Patent is:

1. A multi-band spectroscopic photodetector array comprising:

a substrate having a buffed insulator layer in said substrate for electrically isolating a lower section of said substrate located below said insulator layer from an upper section of said substrate located above said insulator layer; and a plurality of photodetection elements each formed on a different portion of said upper section and each including means for detecting photons in a selected wavelength range;

wherein said different portions of said upper section have different thicknesses and wherein said thicknesses at least in part determine said selected wavelength range of said photons detected by each of said detection elements.

2. A multi-band spectroscopic photodetector array according to claim 1 wherein said substrate comprises Si.

3. A multi-band spectroscopic photodetector array according to claim 1 wherein said buffed insulator layer comprises at least one of silicon oxide, silicon dioxide, silicon nitride, silicon oxynitride, and aluminum oxide.

4. A multi-band spectroscopic photodetector array according to claim 1 wherein said buffed insulator layer has a thickness between about 500 Å and about 1 micron.

5. A multi-band spectroscopic photodetector array according to claim 1 wherein said upper section comprises a material having a characteristic energy band gap and said energy band gap at least in part determines said selected wavelength range of each of said photodetection elements.

6. A multi-band spectroscopic photodetector array according to claim 1 wherein said upper section comprises silicon.

7. A multi-band spectroscopic photodetector array according to claim 6 wherein at least one of said portions of said upper section has a thickness of between about 500 Å and about 2000 Å.

8. A multi-band spectroscopic photodetector array according to claim 6 wherein at least one of said portions of said upper section has a thickness between about 3000 Å and about 6000 Å.

9. A multi-band spectroscopic photodetector array according to claim 6 wherein at least one of said portions of said upper section has a thickness of between about 7000 Å and about 10000 Å.

10. A multi-band spectroscopic photodetector array according to claim 6 wherein a first of said portions of said upper section has a thickness of between about 500 Å and about 2000 Å, a second of said portions of said upper section has a thickness of between about 3000 Å and about 6000 Å, and a third of said portions of said upper section has a thickness of between about 7000 Å and about 10000 Å.

11. A multi-band spectroscopic photodetector array according to claim 6 wherein each of said different portions of said upper section includes a first-type doped upper region and a second-type doped lower region and each of said photodetection elements comprises a photodiode formed from a semiconductor junction between said upper region and said lower region.

12. A multi-band spectroscopic photodetector array according to claim 11 wherein said upper region of each of said different portions is electrically isolated from said upper region of each other of said different portions.

13. A multi-band spectroscopic photodetector array according to claim 11 wherein said lower region of each of said different portions is electrically isolated from said lower region of each other of said different portions.

14. A multi-band spectroscopic photodetector array according to claim 11 wherein said upper region of each of said different portions is n-type doped and said lower region in each of said different portions is p-type doped.

15. A multi-band spectroscopic photodetector array according to claim 11 wherein said upper region of each of said different portions is p-type doped and said lower region in each of said different portions is n-type doped.

16. A multi-band spectroscopic photodetector array according to claim 11 wherein said p-type dopant is boron.

17. A multi-band spectroscopic photodetector array according to claim 11 wherein said n-type dopant is at least one of arsenic, antimony and phosphorous.

18. A multi-band spectroscopic photodetector array according to claim 11 wherein said lower region is doped to have a dopant concentration in a range between about $1\times10^{16}/cm^3$ and about $1\times10^{20}/cm^3$.

19. A multi-band spectroscopic photodetector array according to claim 11 wherein said upper region is doped to have a dopant concentration in the range between about $1\times10^{16}/cm^3$ and about $1\times10^{20}/cm^3$.

20. A multi-band spectroscopic photodetector array according to claim 11 wherein each of said photodetection elements further comprise first ohmic contact means for electrically connecting to said upper region; and second ohmic contact means for electrically connecting to said lower region.

21. A multi-band spectroscopic photodetector array according to claim 1 further comprising an anti-reflection coating formed from an anti-reflective material on each of said photodetection elements for reducing reflection loss at said selected wavelength.

22. A multi-band spectroscopic photodetector array according to claim 21 wherein said anti-reflective material comprises at least one of $SiO_2$, ZnS, $Si_3N_4$, MgF, $Ta_2O_5$, SiC and $TiO_2$.

23. A multi-band spectroscopic photodetector array according to claim 21 wherein said anti-reflection coating comprises a first coating of an anti-reflective material formed on said photodetection element and a second coating of a second anti-reflective material formed on said first coating.

24. A multi-band spectroscopic photodetector array according to claim 23 wherein said first anti-reflective material is $SiO_2$ and said second anti-reflective material is $Si_3N_4$.

25. A multi-band spectroscopic photodetector array according to claim 1 wherein said upper section comprises SiC.

26. A multi-band spectroscopic photodetector array according to claim 25 wherein at least one of said portions of said upper section has a thickness of between about 500 Å and about 2000 Å.

27. A multi-band spectroscopic photodetector array according to claim 25 wherein at least one of said portions of said upper section has a thickness between about 2000 Å and about 4000 Å.

28. A multi-band spectroscopic photodetector array according to claim 25 wherein at least one of said portions of said upper section has a thickness of between about 4000 Å and about 6000 Å.

29. A multi-band spectroscopic photodetector according to claim 25 wherein at least one of said portions of said upper section has a thickness greater than about 2 μm.

30. A multi-band spectroscopic photodetector array according to claim 25 wherein a first of said portions of said upper section has a thickness of between about 500 Å and about 2000 Å, a second of said portions of said upper section has a thickness of between about 2000 Å and about 4000 Å, and a third of said portions of said upper section has a thickness of between about 4000 Å and about 6000 Å, and a fourth of said portions has a thickness greater than about 2 μm.

31. A multi-band spectroscopic photodetector array according to claim 25 wherein each of said different portions of said upper section includes a first-type doped upper region and a second-type doped lower region and each of said light detection elements comprise a photodiode formed from a semiconductor junction between said upper region and said lower region.

32. A multi-band spectroscopic photodetector array according to claim 31 wherein said upper region of each of said different portions is electrically isolated from said upper region of each other of said different portions.

33. A multi-band spectroscopic photodetector array according to claim 31 wherein said lower region of each of said different portions is electrically isolated from said lower region of each other of said different portions.

34. A multi-band spectroscopic photodetector array according to claim 31 wherein said upper region of each of said different portions is p-type doped and said lower region of each of said different portions is n-type doped.

35. A multi-band spectroscopic photodetector array according to claim 31 wherein said upper region of each of said different portions is n-type doped and said lower region of each of said different portions is p-type doped.

36. A multi-band spectroscopic photodetector array according to claim 31 wherein said p-type dopant is one of aluminum and boron.

37. A multi-band spectroscopic photodetector array according to claim 31 wherein said n-type dopant is one of nitrogen and phosphorous.

38. A multi-band spectroscopic photodetector array according to claim 31 wherein said upper region is doped to have a dopant concentration in a range between about $1 \times 10^{16}/cm^3$ and about $1 \times 10^{20}/cm^3$.

39. A multi-band spectroscopic photodetector array according to claim 31 wherein said lower region is doped to have a dopant concentration in the range between about $1 \times 10^{15}/cm^3$ and about $1 \times 10^{20}/cm^3$.

40. A multi-band spectroscopic photodetector array according to claim 31 wherein each of said photodetection elements further comprise
first ohmic contact means for electrically connecting to said upper region; and
second ohmic contact means for electrically connecting to said lower region.

41. A multi-band spectroscopic photodetector array according to claim 1 wherein each of said different portions of said upper section comprise a first layer and a second layer, said first layer being formed from Si and being located adjacent to said buried insulator layer and said second layer being formed from SiC and being formed on said first layer.

42. A multi-band spectroscopic photodetector array according to claim 41 wherein said first layer of at least one of said portions of said upper section has a thickness of between about 100 Å and about 1000 Å, and said second layer has a thickness of between about 500 Å and about 2000 Å.

43. A multi-band spectroscopic photodetector array according to claim 41 wherein said first layer of at least one of said portions of said upper section has a thickness of between about 100 Å and about 1000 Å, and said second layer has a thickness of between about 1000 Å and about 3000 Å.

44. A multi-band spectroscopic photodetector array according to claim 41 wherein said first layer of at least one of said portions of said upper section has a thickness of between about 100 Å and about 1000 Å, and said second layer has a thickness of between about 2000 Å and about 6000 Å.

45. A multi-band spectroscopic photodetector array according to claim 41 wherein said first layer of at least one of said portions of said upper section has a thickness of between about 1000 Å and about 2000 Å and said second layer has a thickness between about 6000 Å and about 8000 Å.

46. A multi-band spectroscopic photodetector array according to claim 41 wherein said first layer of at least one of said portions of said upper section has a thickness of between about 1 μm and about 2 μm and said second layer has a thickness of between about 1 μm and about 2 μm.

47. A multi-band spectroscopic photodetector array according to claim 41 wherein second layer of each of said portions of said upper section has a first-type doped upper region and a second-type doped lower region and said light detection means comprises a photodiode formed from a semiconductor junction between said upper region and said lower region.

48. A multi-band spectroscopic photodetector array according to claim 47 wherein said upper region of said second layer of each of said different portions is p-type doped and said lower region of said second layer of each of said different portions is n-type doped.

49. A multi-band spectroscopic photodetector array according to claim 47 wherein said upper region of said second layer of each of said different portions is n-type doped and said lower region of said second layer of each of said different portions is p-type doped.

50. A multi-band spectroscopic photodetector array according to claim 47 wherein said p-type dopant is at least one of aluminum and boron.

51. A multi-band spectroscopic photodetector array according to claim 47 wherein said n-type dopant is at least one of nitrogen and phosphorous.

52. A multi-band spectroscopic photodetector array according to claim 47 wherein said upper region is doped to have a dopant concentration in a range between about $1 \times 10^{16/cm^3}$ and about $1 \times 10^{20}/cm^3$.

53. A multi-band spectroscopic photodetector array according to claim 47 wherein said lower region is doped to have a dopant concentration in the range of about $1 \times 10^{15}/cm^3$ and about $1 \times 10^{20}/cm^3$.

54. A multi-band spectroscopic photodetector array according to claim 47 wherein each of said photodetection elements further comprise
first ohmic contact means for electrically connecting to said upper region; and
second ohmic contact means for electrically connecting to said lower region.

55. A multi-band spectroscopic photodetector array according to claim 41 wherein said first layer is doped with a first-type dopant and said second layer is doped with a second-type dopant, said first-type dopant being opposite to said second-type dopant and each of said photodetection elements comprise a photodiode formed by a semiconductor junction between said first layer and said second layer of each of said different portions of said upper section.

* * * * *

UNITED STATES PATENT AND TRADEMARK OFFICE
CERTIFICATE OF CORRECTION

PATENT NO. : 5,671,914
DATED : September 30, 1997
INVENTOR(S) : Kalkhoran et al.

It is certified that error appears in the above-identified patent and that said Letters Patent is hereby corrected as shown below:

At column 7, line 32, delete: "...desire case of a range." and insert: "...desired wavelength range.";

At column 13, line 10, delete: "...about $1 \times 1^{20}/cm^3$, ..." and insert: "...about $1 \times 10^{20}/cm^3$, ...";

At column 13, line 27, delete: "...950° C. for ..." and insert: "...950° C for ...";

At column 14, line 60, delete: "... and nm software ..." and insert: "... and run software ...";

At column 15, line 16, delete: "... having a buffed insulator ..." and insert: "... having a buried insulator ...";

At column 15, line 33, delete: "... said buffed insulator ..." and insert: "... said buried insulator ...".

Signed and Sealed this

Eighteenth Day of May, 1999

Attest:

Q. TODD DICKINSON

*Attesting Officer*  *Acting Commissioner of Patents and Trademarks*